(12) United States Patent
Shen et al.

(10) Patent No.: US 10,318,682 B1
(45) Date of Patent: Jun. 11, 2019

(54) SYSTEMS AND METHODS FOR ANALYZING NODE IMPEDANCE STATE

(71) Applicant: Cadence Design Systems, Inc., San Jose, CA (US)

(72) Inventors: Tony Shen, San Jose, CA (US); Amaninder Singh Saini, San Jose, CA (US); Ting Gao, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 232 days.

(21) Appl. No.: 15/640,029

(22) Filed: Jun. 30, 2017

(51) Int. Cl.
*G06F 17/50* (2006.01)

(52) U.S. Cl.
CPC ........ *G06F 17/504* (2013.01); *G06F 17/5036* (2013.01)

(58) Field of Classification Search
CPC .................................................... G06F 17/504
USPC .......................................................... 716/106
See application file for complete search history.

(56) References Cited

U.S. PATENT DOCUMENTS

| 6,083,273 A * | 7/2000 | Takeuchi | G06F 17/5031 716/113 |
| 6,564,355 B1 * | 5/2003 | Smith | G06F 17/5036 716/115 |
| 6,937,971 B1 * | 8/2005 | Smith | G06F 17/5036 703/18 |
| 7,587,305 B2 * | 9/2009 | Lutz | G06F 17/5022 703/15 |
| 2016/0210394 A1 * | 7/2016 | Lin | G06F 17/5081 |
| 2019/0018059 A1 * | 1/2019 | Grabinski | G01R 31/2834 |

* cited by examiner

*Primary Examiner* — Suresh Memula
(74) *Attorney, Agent, or Firm* — Schwegman Lundberg & Woessner, P.A.

(57) ABSTRACT

Various embodiments provide for analyzing impedance states of a set of nodes in a circuit design and providing a set of reasons for those impedance states. The set of reasons can include a reason regarding why a particular node is reported as being in high-impedance (highz) state or in low-impedance (lowz) state, and the reason may be for a specific time point during transient analysis of the circuit design. Some embodiments are implemented within a debugging utility of an electronic design automation (EDA) software system.

20 Claims, 9 Drawing Sheets

600

ANALYSIS RESULTS 602

```
Highz net: net0  1V
        M1a   OFF (ids=1e-11 gds=1e-11 region=OFF)    net1a   HIGHZ
        M1b   ON (ids=2e-3 gds=2e-6 region=TRIODE)    net1b   HIGHZ net1b 2V
            M2a   OFF (ids=1e-11 gds=1e-11 region=OFF)    net2a   HIGHZ
            M2b   OFF (ids=2e-11 gds=2e-11 region=OFF)    net2b   HIGHZ M1c   ON (ids=3e-3 gds=3e-6 region=TRIODE)    net1c   HIGHZ net1c 3V
            M2c   OFF (ids=1e-11 gds=1e-11 region=OFF)    net2c   HIGHZ
            R2d   ON (res=1k)       net2d   HIGHZ net2d  4V
                M3a OFF (ids=4.3e-11 gds=1.6e-11 region=OFF)   net3a   LOWZ
```

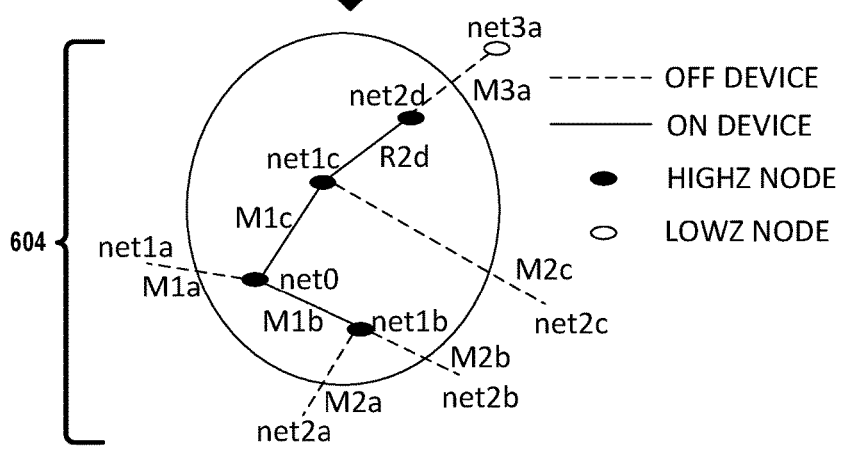

FIG. 6

700
```
ANALYSIS RESULTS 702
Lowz net:   net3a      3.0V
       M4    ON  (ids=-4.5e-07    gds=6.6e-03    region=SATURATION)
       net4     2.5V
       M5    ON  (ids=1.6e-07     gds=6.3e-08    region=TRIODE)
       net5     2.0V
       R6    ON  (res=1k)
       net6     1.0V
       M7    ON  (ids=1.6e-07     gds=6.3e-08    region=TRIODE)
       0        0.000000V
```
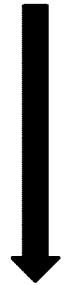
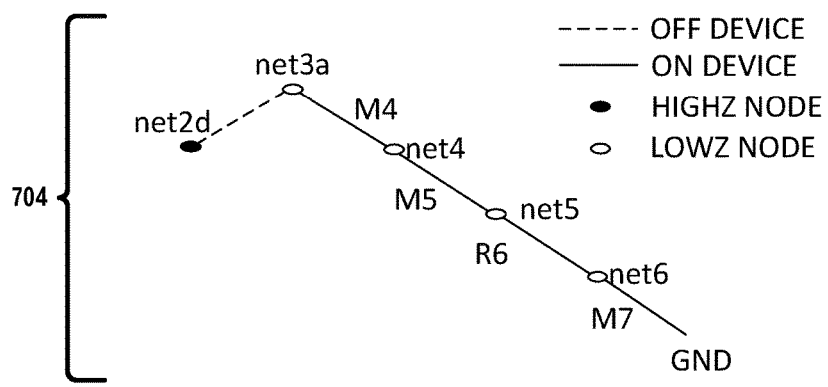
FIG. 7

SYSTEMS AND METHODS FOR ANALYZING NODE IMPEDANCE STATE

TECHNICAL FIELD

Embodiments described herein relate to electronic design automation (EDA), and to systems, methods, devices, and instructions for analyzing node impedance state in a circuit design.

BACKGROUND

Electronic design automation (EDA) software systems usually include a circuit design simulator (e.g., design simulator), such as Simulation Program with Integrated Circuit Emphasis (SPICE) or a variant, for solving and verifying circuit designs. Generally, to simulate operation of a circuit design, the design simulator parses and operates on a circuit netlist (also known simply as a netlist) that describes a circuit model of the circuit design and specifies conditions under which operation of the circuit model will be simulated. The circuit model may include model elements (e.g., transistors), parameters (e.g., process/device), and connectivity (e.g., topology), while the conditions may include inputs to the circuit model for the simulation intervals (e.g., waveform profiles).

As part of the simulation, a circuit design simulator may perform transient analysis to determine output signals of a circuit design in response to input signals. An aspect of the transient analysis includes determining the impedance state of a node of the circuit design. The impedance state of a particular node may be in high-impedance (highz) state or in low-impedance (lowz) state. A particular node may be considered in high-impedance state when there is no conducting path from the particular node to ground or a voltage source (e.g., direct current [DC] power supply), and may be considered low-impedance state when there is a conducting path from the particular node to ground or a voltage source.

Unfortunately, in highz state, a particular node of a circuit design can cause a transistor in the circuit design to switch unexpectedly, which in turn can cause an integrated circuit (IC) implemented by the circuit design to fail once on silicon. As a result, detection of nodes in highz state (hereafter, highz nodes) in a circuit design is important early in the design cycle.

BRIEF DESCRIPTION OF THE DRAWINGS

Various ones of the appended drawings merely illustrate example embodiments of the present disclosure and should not be considered as limiting its scope.

FIGS. 6 and 7 are diagrams illustrating analysis results and circuit design schematics produced by various embodiments.

DETAILED DESCRIPTION

Figure 1:
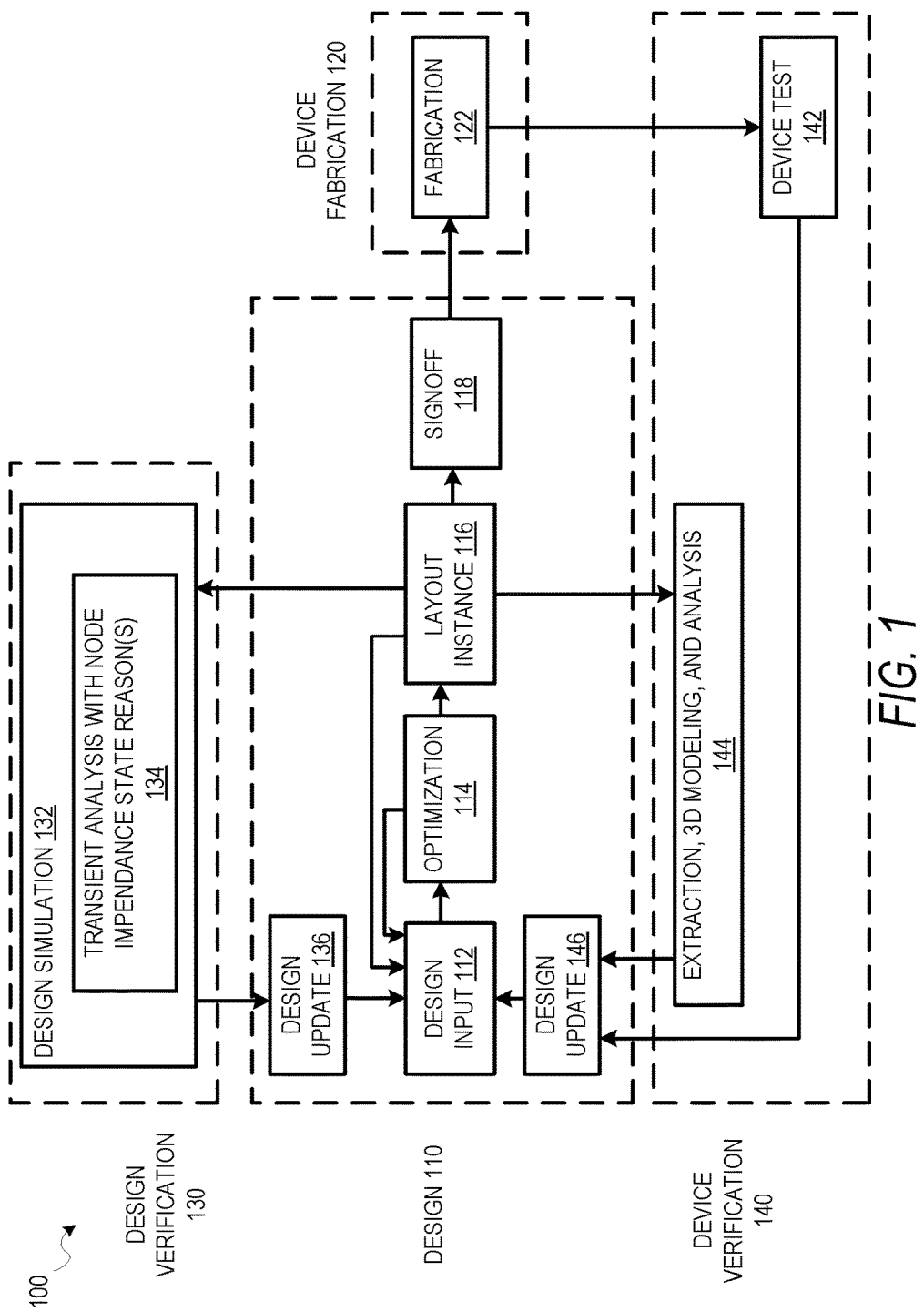
FIG. 1 is a diagram illustrating an example design process flow for producing a circuit based on timing analysis that uses transient analysis with node impedance state reason(s), according to some embodiments.

Various traditional EDA software systems can check for and report on impedance state of nodes based on design simulation. Unfortunately, such EDA software systems do not provide one or more reason(s) as to why a reported node is in a particular impedance state (e.g., highz or lowz state), which can be useful in debugging and resolving a circuit design that includes impedance-related issues, such as the presence of one or more highz nodes.

Various embodiments described herein provide systems, methods, devices, and instructions for analyzing impedance states of a set of nodes in a circuit design and providing a set of reasons for those impedance states. The set of reasons can include a reason regarding why a particular node is reported as being in lowz state or in highz state, and the reason may be for a specific time point during transient analysis of the circuit design. Some embodiments are implemented within a debugging utility of an EDA software system. Depending on the embodiment, the set of reasons may be provided by way of a textual description (e.g., generated text-based report that presents a graphical user interface (GUI) of an EDA software system), a circuit schematic representing a circuit design (e.g., circuit schematic view of the circuit design displayed through the GUI, such as an analog design environment (ADE])), or some combination thereof. For example, with respect to a circuit schematic, the set of reasons may comprise a set of annotations that represent one or more of the reasons and that are included by (e.g., displayed on portions of) the circuit schematic. A given reason, for instance, may comprise an annotation (e.g., color, text, line style, or the like) that is applied to a conductive path between two nodes graphically represented in the circuit schematic.

As used herein, a node can include a node as defined within a netlist that describes a circuit design (e.g., node in a hierarchical topology of the circuit design as defined by the netlist). A node in a circuit design can couple together two or more circuit components of the circuit design. As used herein, a circuit component can include a transistor, a resistor, an inductor, a capacitor, or the like. As used herein, a node in high-impedance (highz) state may comprise one where there is no conductive path from the node to ground or a voltage source (e.g., DC power supply). As used herein, a node in low-impedance (lowz) state may comprise one where there is at least one conductive path from the particular node to ground or a voltage source. A node in highz state may be referred to herein as a highz node or a floating node, and a node in lowz state may be referred to herein as a lowz node. As used herein, annotations may comprise visual or text-based annotations. Examples of annotations can include, without limitation, line styles, fill styles, color, tags, text, a key for explaining annotations, shapes, symbols, icons, and pictures.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for producing a circuit based on timing analysis that uses transient analysis with node impedance state reason(s) 134, according to some embodiments. It will be apparent that other design process flow operations may function using the transient analysis processes described herein, but the design process flow 100 is described here for the purposes of illustration. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, timing analysis and optimization are performed in an optimization 114 operation, along with any other automated design processes. Additionally, design constraints for blocks of a circuit design generated with design inputs in the design input 112 operation may be analyzed using timing analysis. While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118, as described below.

After design inputs are used in the design input 112 operation to generate a circuit layout, and any of the optimization 114 operations are performed, a layout is generated in the layout instance 116. The layout describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the optimization 114 operation may be performed.

As shown, the design simulation 132 includes the transient analysis with node impedance state reason(s) 134, which in accordance with some embodiments, determine an impedance states (hereafter, impedance) for each node in a set of nodes of a circuit design (e.g., as represented by the layout instance 116) and a set of reasons for those node impedance states. More regarding design simulation including transient analysis with node impedance state reason(s) are described with respect to FIG. 2.

Figure 2:
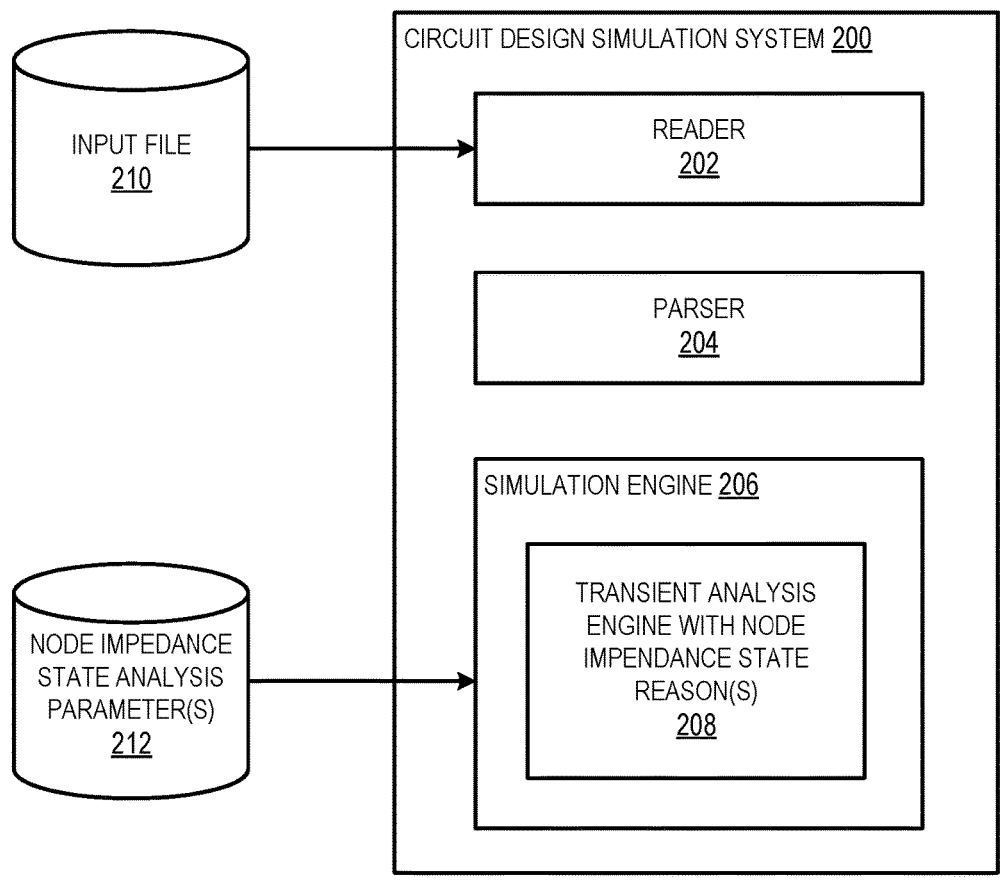
FIG. 2 is a flow diagram illustrating example operations of a circuit design simulation system, according to some embodiments.

FIG. 2 is a flow diagram illustrating example operations of a circuit design simulation system 200, according to some embodiments. The circuit design simulation system 200 receives an input file 210 comprising comprise a text-based (ASCII) file with a listing of circuit components and their respective interconnections of a circuit design. For instance, the input file 210 may include netlist data that describes the circuit design for simulation.

The circuit design simulation system 200 includes a reader 202 that reads in the input file 210, a parser 204 that determines the netlist elements, and a simulation engine 206 that simulates the circuit design based on the determined netlist elements. For instance, the simulation engine 206 and the circuit design simulation system 200 may be based on an implementation of SPICE, a transistor-level circuit simulator that formulates a large set of equations representing a circuit design. The reader 202 may be a conventional file reader and the parser 204 may include a lexer that performs lexical analysis on the file contents.

The simulation engine 206 includes a transient analysis engine 208 with node impedance state reason(s). Based on netlist element data provided by the parser 204, the transient analysis engine 208 can perform transient analysis on a circuit design to determine a set of output signals based on a set of input signals over a period of time. During transient analysis, the transient analysis engine 208 can determine, at a set of time points, an impedance for each node in a set of nodes of the circuit design (as described by netlist element data) and a set of reasons for those node impedance states. For some embodiments, the node impedance state of a particular node comprises a low impedance state or a high impedance at a particular time point during transient analysis.

For instance, the transient analysis engine 208 determines a particular node of a circuit design as having a low impedance (lowz) state in response to identifying at least one conductive path between the particular node and at least one of ground (e.g., a ground node or Vss) or a voltage source (e.g., a node representing V, Vcc, Vee or Vdd) in the circuit design. Additionally, the transient analysis engine 208 determines that the particular node has a high impedance (highz) state in response to failing to identify at least one conductive path between the particular node and at least one of ground or a voltage source (e.g., DC power supply) in the circuit design. As the transient analysis engine 208 attempts to identify conductive paths between the particular node and ground or voltage source, the transient analysis engine 208 can remember store information (e.g., as part of impedance data) regarding a set of conductive paths in the circuit design reachable from the particular node.

For some embodiments, the transient analysis engine 208 detects highz in a circuit design according to a set of rules that determine behavior of various circuit components, coupled to nodes within the circuit design, during transient analysis of the circuit design. This process may also be referred to as floating node detection. The set of rules can include a set of conducting rules that determine when a particular type of circuit component, in the circuit design, is conducting and when it is not. For instance, an example set of conducting rules can include, without limitation, one or more of the following: a MOSFET (metal-oxide-semiconductor field-effect transistor) is conducting if its region is in triode or saturation; a JFET (junction gate field-effect transistor) is always conducting; a BJT (bipolar junction transistor) is conducting when Vbe>bjt_vbe or Ic>bjt_ith; a diode is conducting when V>diode_vth; a resistor, control resistor, or inductor is conducting when R<=res_th; a Isource or Vcc is conducting when I>isource_ith; a Vsource is always conducting; and all other device types are not conducting. One or more of the parameters considered in the set of rules (e.g., conducting rules) can be set (e.g., "bjt_vbe=0.4," "bjt_ith=50 nA," "diode_vth=0.6," "res_th=1 TOhm," and "isource_ith=1e-12"), or overwritten from their default values, during or prior to the transient analysis being performed on the circuit design.

While determining the impedance for each node in the set of nodes at the set of time points, the transient analysis engine 208 can determine at least one of: a voltage of a given node; an on/off state of a circuit component (e.g., transistor, resistor, inductor, capacitor, etc.) of the circuit design coupled to a given node; and a set of component parameters that determine the on/off state of the circuit component. With respect to the transient analysis engine 208 determining an impedance for each node in a set of nodes of the circuit design at a set of time points, the set of nodes, the set of time points, or both may be specified by node impedance state analysis parameter(s) 212 (e.g., "debug_net=[ . . . ]" specifying the nodes and "debug_time=[ . . . ]" specifying the time points) provided by simulation engine 206. Other parameter(s) 212 considered by the transient analysis engine 208 during analysis can include, for instance, one or more of the following: the set of conducting rules described herein; a duration parameter that specifies a time duration value after which a node would be considered a highz node (e.g., "duration=5 ns"); a time window in which the analysis shall be performed (e.g., "time_window[1 n 10 n]" to specify a window of 1 ns to 10 ns); and a fanout setting that filters nodes with specified connections (e.g., "fanout=" is set to "all," "gate," or "bulk").

Figure 3:
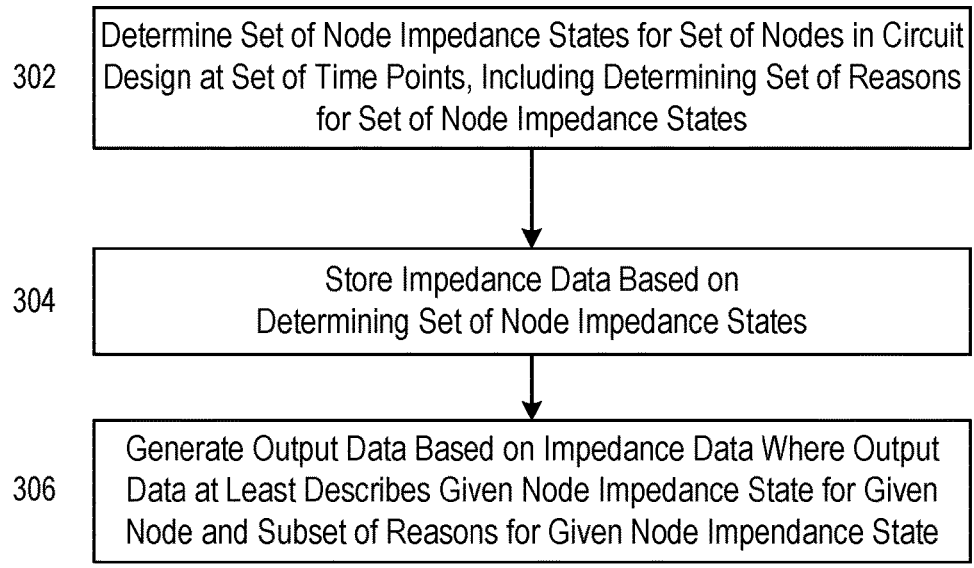
FIGS. 3-5 are flowcharts illustrating example methods for analyzing impedance states of a set of nodes in a circuit design and providing a set of reasons for those impedance states, according to some embodiments.
Figure 4:
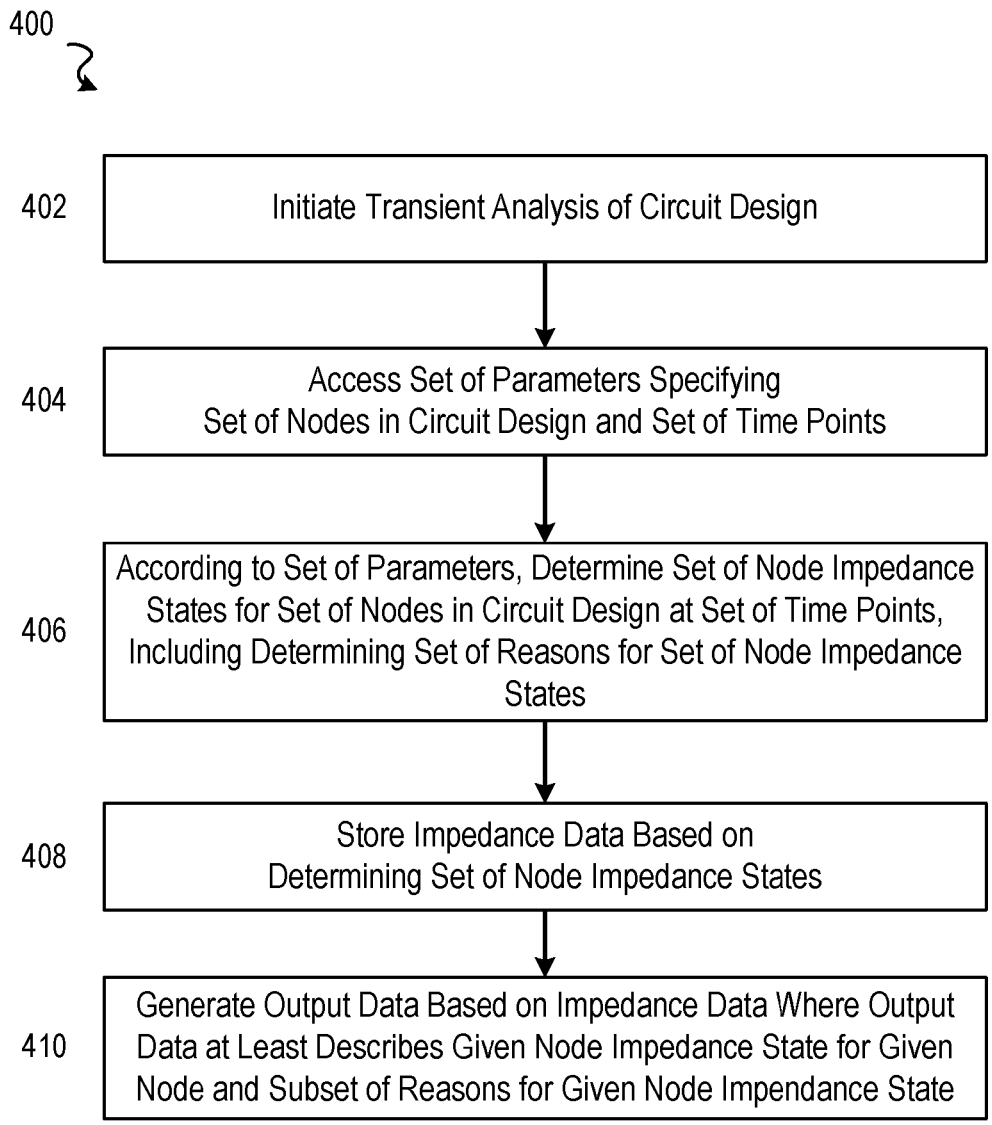

FIGS. 3-4 are flowcharts illustrating example methods for analyzing impedance states of a set of nodes in a circuit design and providing a set of reasons for those impedance states, according to some embodiments. It will be understood that example methods described herein may be performed by a device, such as a computing device executing instructions of an EDA system or a circuit design simulation system (e.g., 200), in accordance with some embodiments. Additionally, example methods described herein may be implemented in the form of executable instructions stored on a computer-readable medium or in the form of electronic circuitry. For instance, the operations of a method 300 of FIG. 3 may be represented by executable instructions that, when executed by a processor of a computing device, cause the computing device to perform the method 300. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 3, the flowchart illustrates an example method 300 for analyzing impedance states of a set of nodes in a circuit design and providing a set of reasons for those impedance states, according to some embodiments. For some embodiments, the method 300 is performed as part of a transient analysis of a circuit design (e.g., by a circuit design simulator). An operation of the method 300 (or another method described herein) may be performed by a hardware processor (e.g., central processing unit or graphics processing unit) of a computing device (e.g., desktop, server, etc.).

The method 300 as illustrated begins with operation 302 determining an impedance for each node in a set of nodes of a circuit design at a set of time points, where determining the impedance includes determining a set of reasons for the determined impedance. Operation 302 may also involve determining a set of voltage values for the set of nodes, the on/off state of a set of circuit components coupled to the set of nodes, and a set of component parameters that determine the on/off state of the set of circuit components. One or more of these may be determined during operation 302 at the set of time points and, additionally, may be included as part of the set of reasons for the impedance.

The method 300 continues with operation 304 storing (to a data storage device, such as main memory) impedance data that is based on the determination of the impedances at operation 302. According to some embodiments, the impedance data includes information regarding the impedance (determined at operation 302) and the set of reasons (determined at operation 302) for the determined impedance. In addition to impedances, the impedance data can include other information determined by operation 302, such as the set of voltage values for the set of nodes, the on/off state of the set of circuit components coupled to the set of nodes, and the set of component parameters determining the on/off state of the set of circuit components.

The method 300 continues with operation 306 generating output data based on the impedance data stored at operation 304, where the output data at least describes, in association with a given node in the set of nodes, a given node impedance state for the given node and a subset of reasons for the given node impedance state. According to various embodiments, the given node impedance state is from the set of node impedance states determined at operation 302, and the subset of reasons is from the set of reasons determined at operation 302.

Depending on the embodiment, the output data may comprise a text-based report, a circuit design schematic representing the circuit design, or some combination thereof. For instance, the output data may comprise a circuit schematic at least depicting the given node, a set of conductive paths connecting the given node to a subset of nodes in the set of nodes, the given node impedance state for the given node impedance state, and the subset of reasons for the given node impedance state. The subset of reasons may be depicted on the circuit design by a set of annotations included by the circuit design schematic.

In another instance, the output data may comprise a text-based report that describes the given node and the given node impedance state for the given node, and may further describe one or more of voltage of the given node, an on/off state of a circuit component of the circuit design coupled to the given node, and a set of component parameters that determine the on/off state of the circuit component.

Where the output data comprises a circuit design schematic, generating the output data comprises back-annotating, based on the subset of reasons, an existing circuit design schematic representing the circuit design. For instance, generating the output data may comprise: generating a text-based report at least describing, in association with a given node in the set of nodes, the given node impedance state for the given node and the subset of reasons for the given node impedance state; and then back-annotating, based on the generated text-based report, an existing circuit design schematic representing the circuit design.

More regarding example output data comprising a circuit design schematic is described below with respect to FIGS. 6 and 7.

For some embodiments, responsive to determining that the given node impedance state comprises a low impedance state, the subset of reasons for the given node impedance state at least describes (e.g., includes information regarding) one conductive path, in the circuit design, between the given node and at least one of ground or a voltage source in the circuit design. For some embodiments, responsive to determining that the given node impedance state comprises a high impedance state, the subset of reasons for the given node impedance state at least describes (e.g., includes information regarding) all conductive paths in the circuit design reachable from the given node. Additionally, for some embodiments, the subset of reasons for the given node impedance state at least describes (e.g., includes information regarding) one of a voltage of the given node, an on/off state of a circuit component of the circuit design coupled to the given node, and a set of component parameters that determine the on/off state of the circuit component. Depending on the embodiment, the subset of reasons can include other key parameters that determine behavior of the circuit component.

Referring now to FIG. 4, the flowchart illustrates an example method 400 for analyzing impedance states of a set of nodes in a circuit design and providing a set of reasons for those impedance states, according to some embodiments. Like the method 300 of FIG. 3, the method 400 may be performed as part of a transient analysis of a circuit design. An operation of the method 400 may be performed by a hardware processor.

The method 400 as illustrated begins with operation 402 initiating a transient analysis of a circuit design, which as described herein, may be performed by a circuit design simulator (e.g., SPICE or a variant). The transient analysis may be performed according to a set of parameters that may be general to the transient analysis.

The method 400 continues with operation 404 accessing a set of parameters specifying a set of nodes in the circuit design and a set of time points. In addition, the set of parameters may specify one or more of a set of conducting rules, a duration parameter for determining a highz node, a time window in which the node impedance state analysis shall be performed, or a fanout setting as described herein.

The method 400 continues with operation 406 determining the impedance for each node in the set of nodes of a circuit design at the set of time points, in accordance with the set of parameters accessed by operation 404. Additionally, as noted herein, operation 406 may be performed during performance of the transient analysis initiated by operation 402.

The method 400 continues with operations 408 and 410, which according to some embodiments, are respectively similar to operations 304 and 306 of the method 300 described above with respect to FIG. 3.

Figure 5:
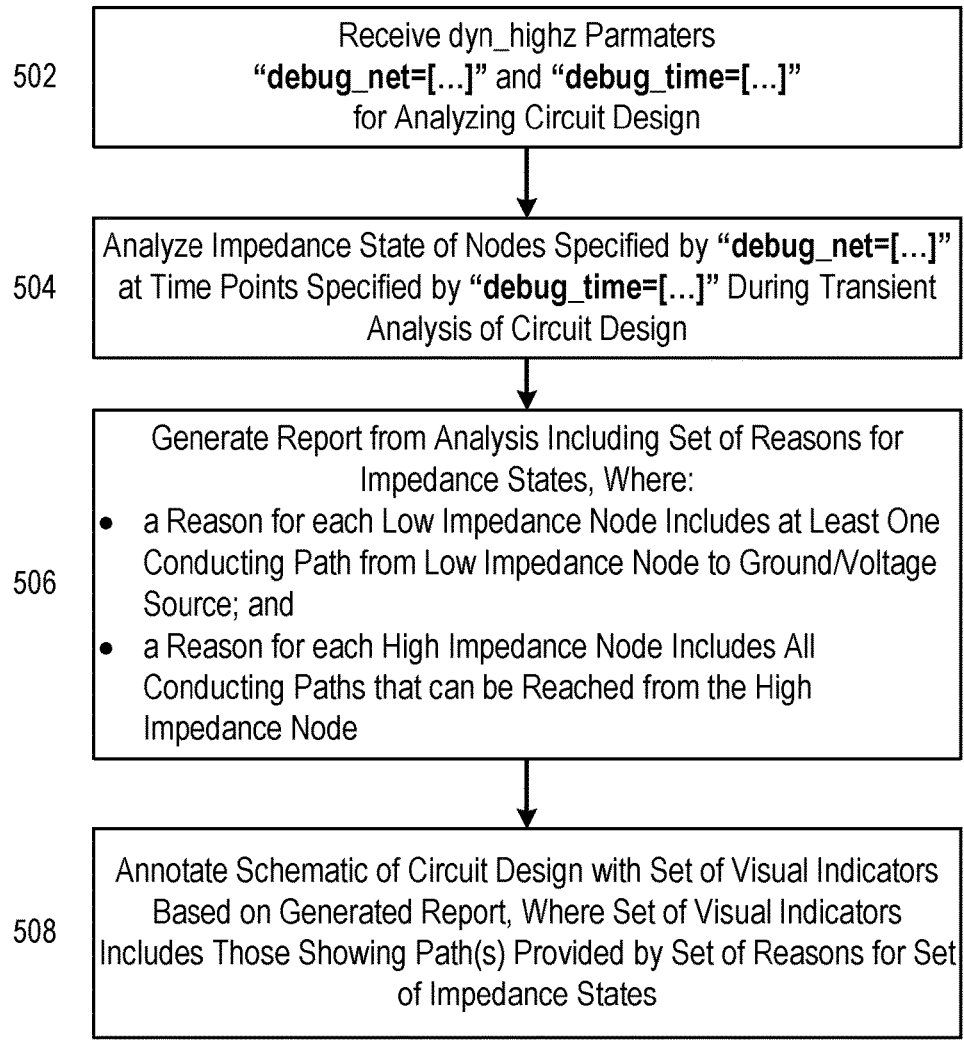

FIG. 5 is a flowchart illustrating an example method 500 for analyzing impedance states of a set of nodes in a circuit design and providing a set of reasons for those impedance states, according to some embodiments. Like the method 300 of FIG. 3, the method 500 may be performed as part of a transient analysis of a circuit design. An operation of the method 500 may be performed by a hardware processor.

As shown, the method 500 as illustrated begins with operation 502 receiving dyn_highz parameters "debug_net=[ . . . ]" and "debug_time=[ . . . ]" for analyzing a set of nodes in a circuit design for node impedances states.

The method 500 continues with operation 504 analyzing impedance state of node specified by "debug_net=[ . . . ]" at time points specified by "debug_time=[ . . . ]" during transient analysis of the circuit design.

Subsequently, the method 500 continues with operation 506 generating a report from the analysis performed at operation 504, where the report includes a set of reasons for the impedance states of the nodes specified by "debug_net= [ . . . ]" at each time point specified in "debug_time= [ . . . ]." According to some embodiments, a reason for each low impedance node includes at least one conducting path from the low impedance node to ground or a voltage source. According to some embodiments, a reason for each high impedance node includes all conducting paths reachable from the high impedance node. Additionally, the report could include node voltage or a set of component parameters that can determine whether a circuit component (e.g., transistor) is on or off.

The method 500 continues with operation 508 annotating a schematic of the circuit design (e.g., back-annotating the schematic) with a set of visual indicators based on the generated report. The set of visual indicators can include those showing the path(s) provided by the set of reasons (from operation 506) for the set of impedance states. In this way, the schematic can be annotated to show the reasons behind the node impedance state determined for each node in the set of nodes of the circuit design.

FIG. 6 is diagram 600 illustrating analysis results 602 (e.g., a report) and a circuit design schematic 604 produced by various embodiments. In particular, the analysis results 602 and the circuit design schematic 604 each represent output data that could be generated by various embodiments described herein. In FIG. 6, the analysis results 602 describes that node net0 of a circuit design is in highz impedance state, describes that has node net0 has a node voltage value of 1V, and describes the various reasons for node net0's highz impedance state. In particular, the reasons depicted in FIG. 6 include all conductive paths in the circuit design reachable from node net0.

With respect to reasons for the highz impedance state of node net0, the analysis results 602 provide various details regarding MOSFET devices M1a, M1b, and M1c of the circuit design. For example, with respect to device M1a, the analysis results 602 indicate that device M1a is OFF, provide various device parameters of device M1a that are causing its OFF state (e.g., ids=1e-11, gsd=1e-11, and its region is OFF), and indicate that device M1a couples node net0 to node net1a, which is in highz impedance state as well. With respect to device M1b, the analysis results 602 indicate that device M1b is ON, provide various device parameters of device M1b that are causing its ON state (e.g., ids=2e-3, gsd=2e-6, and its region is in TRIODE), and indicate that device M1b couples node net0 to node net1b, which is in highz impedance state as well. With respect to device M1c, the analysis results 602 indicate that device M1c is ON, provide various device parameters of device M1c that are causing its ON state (e.g., ids=3e-3, gsd=3e-6, and its region is in TRIODE), and indicate that device M1c couples node net0 to node net1c, which is in highz impedance state as well. The analysis results 602 further provide a breakdown of reasons for the highz impedance state of nodes net1b and net1c.

According to some embodiments, the details provided by analysis results 602 are depicted in a circuit design schematic 604 of the circuit design. As shown, the circuit design schematic 604 depicts paths between nodes net3a, net2d, net1c, net2c, net0, net1b, net2b, net2a, and net1a representing circuit components (e.g., MOSFET devices M1a, M1b, and M1c and resistor R2d), which may have an ON or OFF state. As also shown, node net0 has a conductive path to nodes net1c, net2d, and net1b (i.e., reachable from node net0), but lacks a conductive path from node net0 to a voltage source or ground (e.g., causing node net0 to be in a high impedance state). Additionally, as shown, node net0 cannot reach nodes net1a, net2a, net2b, net3a, or net2c by a conductive path.

FIG. 7 is diagram 700 illustrating an analysis results 702 (e.g., a report) and a circuit design schematic 704 produced by various embodiments. Like with respect to FIG. 6, the analysis results 702 and the circuit design schematic 704 each represent output data that could be generated by various embodiments described herein. In FIG. 7, the analysis results 702 describe that node net3a of a circuit design is in lowz impedance state, describe that has node net3a has a node voltage value of 3.0V, and describe a least one reason for this node net3a's lowz impedance state. In particular, the at least one reason depicted in FIG. 7 includes a conductive path from node net3a to ground (node GND or node 0).

With respect to details, the analysis results 702 provide various details regarding the conductive path from net3a to node net4 through MOSFET device M4, to node net5 through MOSFET device M5, to node net6 through resistor R6, and to node GND (node 0) through MOSFET device M7. For instance, the analysis results 602 indicate that each of device M4, device M5, resistor R6, and device M7 is ON, provide various device parameters that are causing their respective ON state (e.g., for device M4, ids=4.5e-07, gsd=1e-11, and its region is SATURATION), and provide the node voltage of each of nodes net4, net5, net6, and node 0 (node GND).

In accordance with some embodiments, the details provided by analysis results 702 are depicted in a circuit design schematic 704 of the circuit design. As shown, the conductive path from node net3a to node GND passes through nodes net4, net5, and net6 through device M4, device M5, resistor R6 and device M7. As also shown, there is a non-conductive path between node net3a to node net2d.

Figure 8:
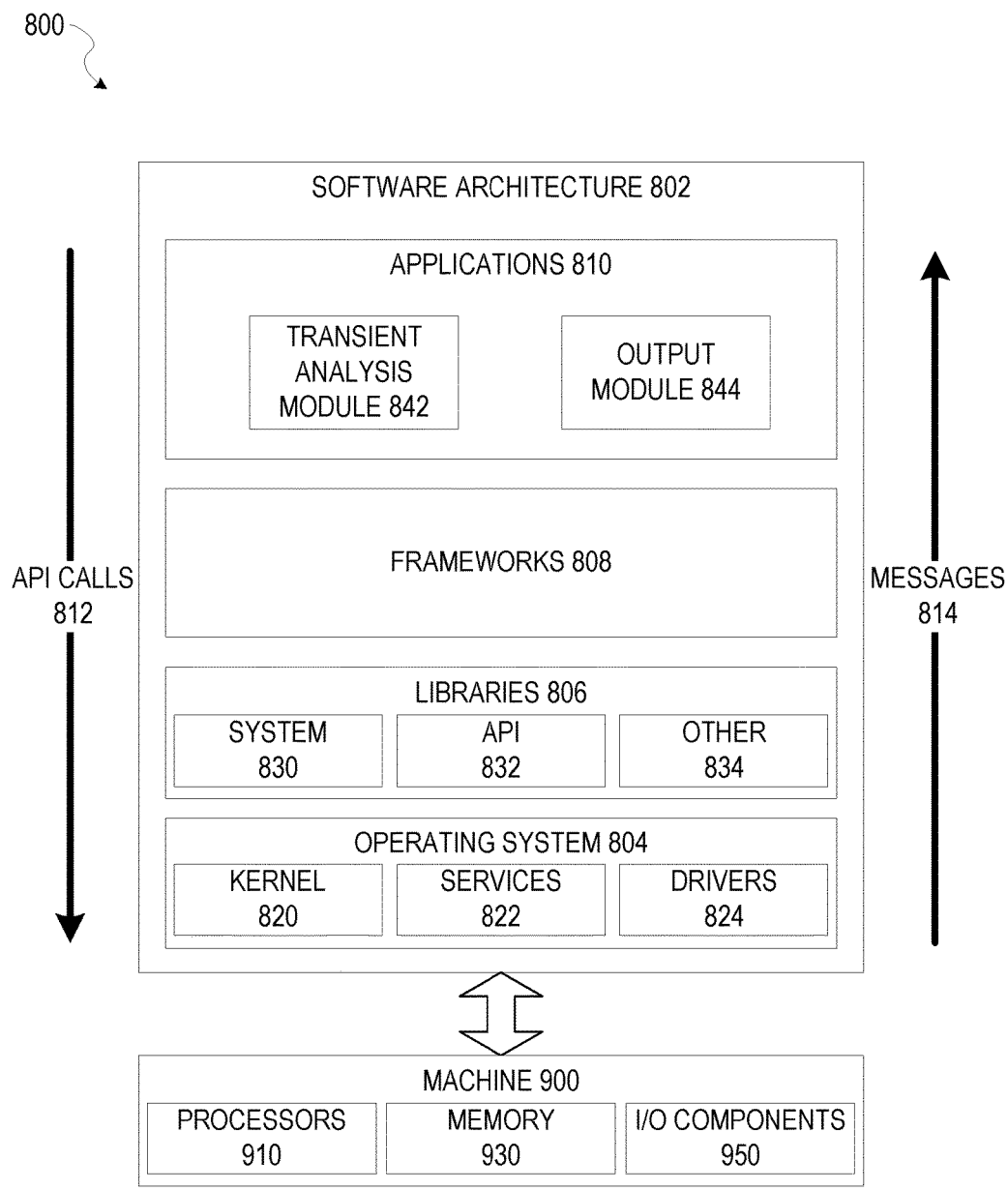
FIG. 8 is a block diagram illustrating an example of a software architecture that may be operating on an EDA computing device and may be used with methods for analyzing impedance states of a set of nodes in a circuit design and providing a set of reasons for those impedance states, according to some embodiments.

FIG. 8 is a block diagram 800 illustrating an example of a software architecture 802 that may be operating on an EDA computer and may be used with methods for analyzing impedance states of a set of nodes in a circuit design and providing a set of reasons for those impedance states, according to some example embodiments. The software architecture 802 can be used as an EDA computing device to implement any of the methods described above. Aspects of the software architecture 802 may, in various embodiments, be used to store circuit designs and execute transient analysis or optimization in an EDA environment to generate circuit designs, with physical devices generated using these circuit designs.

FIG. 8 is merely a non-limiting example of a software architecture 802, and it will be appreciated that many other architectures can be implemented to facilitate the functionality described herein. In various embodiments, the software architecture 802 is implemented by hardware such as a machine 900 of FIG. 9 that includes processors 910, memory 930, and I/O components 950. In this example, the software architecture 802 can be conceptualized as a stack of layers where each layer may provide a particular functionality. For example, the software architecture 802 includes layers such as an operating system 804, libraries 806, software frameworks 808, and applications 810. Operationally, the applications 810 invoke application programming interface (API) calls 812 through the software stack and receive messages 814 in response to the API calls 812, consistent with some embodiments. In various embodiments, any client device, server computer of a server system, or other device described herein may operate using elements of the software architecture 802. An EDA computing device described herein may additionally be implemented using aspects of the software architecture 802, with the software architecture 802 adapted for operating to analyze impedance states of a set of nodes in a circuit design and providing a set of reasons for those impedance states in any manner described herein.

In one embodiment, an EDA application of the applications 810 performs impedance state analysis, according to embodiments described herein, using various modules within the software architecture 802. For example, in one embodiment, an EDA computing device similar to the machine 900 includes the memory 930 and the one or more processors 910. The processors 910 also implement the transient analysis module 842 to determine a set of node impedance states for a set of nodes in a circuit design at a set of time points and a set of reasons for the determined set of node impedance states, store impedance data based on the determining the set of node impedance states, generate output data based on the impedance data, where the output data at least describes a given node impedance state for the given node and a subset of reasons for the given node impedance state.

A processor-implemented output module 844 may then be used to update a display of the I/O components 950 of the EDA computing device with transient analysis results, including impedance states and reasons for the impedance states.

In various other embodiments, rather than being implemented as modules of the one or more applications 810, some or all of the modules 842 and 844 may be implemented using elements of the libraries 806, the operating system 804, or the frameworks 808.

In various implementations, the operating system 804 manages hardware resources and provides common services. The operating system 804 includes, for example, a kernel 820, services 822, and drivers 824. The kernel 820 acts as an abstraction layer between the hardware and the other software layers, consistent with some embodiments. For example, the kernel 820 provides memory management, processor management (e.g., scheduling), component management, networking, and security settings, among other functionality. The services 822 can provide other common services for the other software layers. The drivers 824 are responsible for controlling or interfacing with the underlying hardware, according to some embodiments. For instance, the drivers 824 can include display drivers, signal processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 806 provide a low-level common infrastructure utilized by the applications 810. The libraries 806 can include system libraries 830 such as libraries of blocks for use in an EDA environment or other libraries that can provide functions such as memory allocation functions, string manipulation functions, mathematic functions, and the like. In addition, the libraries 806 can include API libraries 832 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 806 may also include other libraries 834.

The software frameworks 808 provide a high-level common infrastructure that can be utilized by the applications 810, according to some embodiments. For example, the software frameworks 808 provide various GUI functions, high-level resource management, high-level location services, and so forth. The software frameworks 808 can provide a broad spectrum of other APIs that can be utilized by the applications 810, some of which may be specific to a particular operating system 804 or platform. In various embodiments, the systems, methods, devices, and instructions described herein may use various files, macros, libraries, and other elements of an EDA design environment to implement analysis described herein. This includes analysis of input design files for an integrated circuit design, along with any element of hierarchical analysis that may be used as part of or along with the embodiments described herein. While netlist files, library files, SDC files, and view definition files are examples that may operate within the software architecture 802, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) is configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 900 including processors 910), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 900, but deployed across a number of machines 900. In some example embodiments, the processors 910 or processor-implemented modules are located in a single geographic location (e.g., within a home environment, an office environment, or a server farm). In other example embodiments, the processors or processor-implemented modules are distributed across a number of geographic locations.

Figure 9:
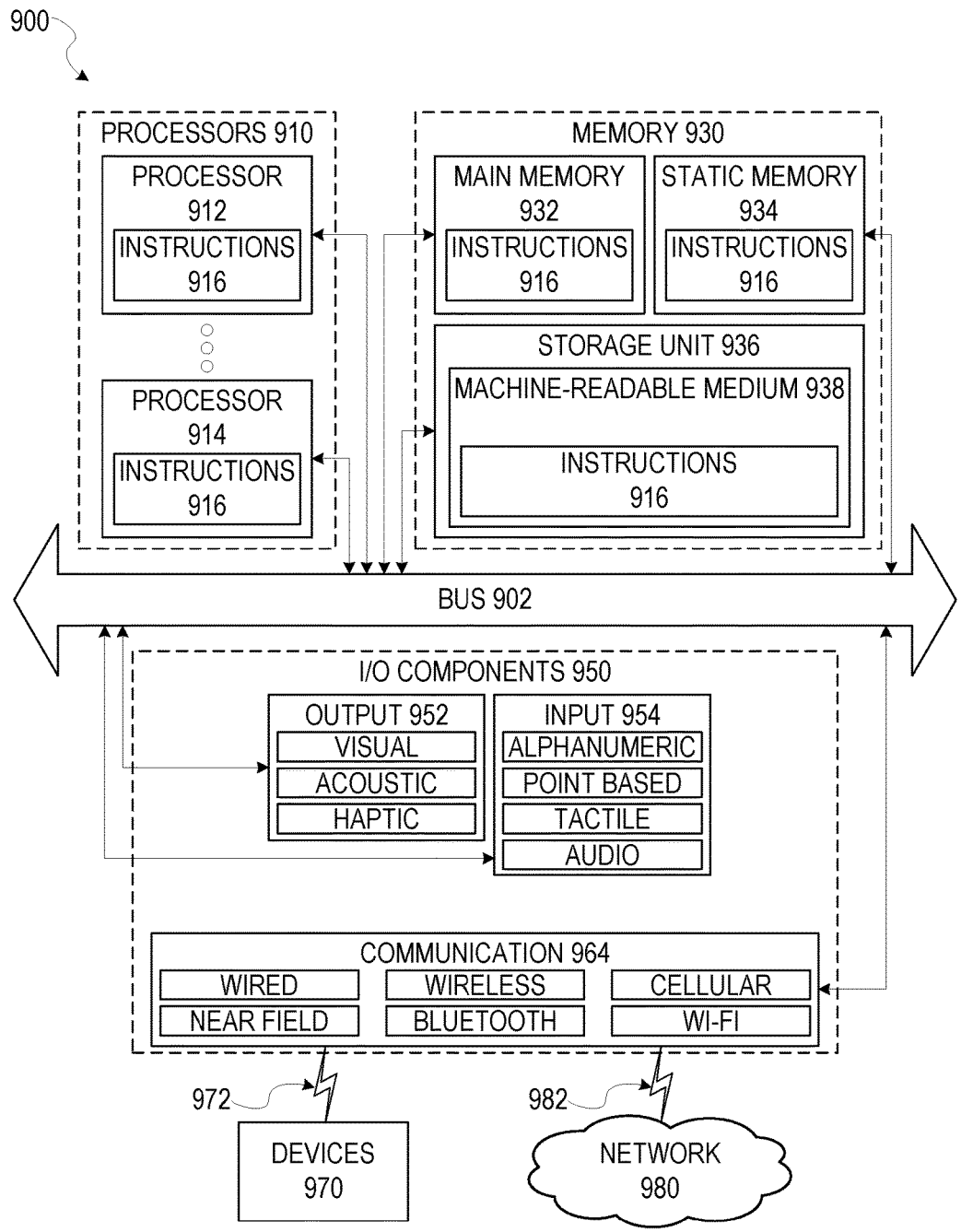
FIG. 9 is a diagram representing a machine in the form of a computer system within which a set of instructions are executed, causing the machine to perform any one or more of the methods discussed herein, according to some example embodiments.

FIG. 9 is a diagrammatic representation of the machine 900 in the form of a computer system within which a set of instructions may be executed for causing the machine 900 to perform any one or more of the methodologies discussed herein, according to an example embodiment. FIG. 9 shows components of the machine 900, which is, according to some embodiments, able to read instructions from a machine-readable medium (e.g., a machine-readable storage medium) and perform any one or more of the methodologies discussed herein. Specifically, FIG. 9 shows a diagrammatic representation of the machine 900 in the example form of a computer system, within which instructions 916 (e.g., software, a program, an application, an applet, an app, or other executable code) for causing the machine 900 to perform any one or more of the methodologies discussed herein can be executed. In alternative embodiments, the machine 900 operates as a standalone device or can be coupled (e.g., networked) to other machines. In a networked deployment, the machine 900 may operate in the capacity of a server machine or a client machine in a server-client network environment, or as a peer machine in a peer-to-peer (or distributed) network environment. The machine 900 can comprise, but not be limited to, a server computer, a client computer, a personal computer (PC), a tablet computer, a laptop computer, a netbook, or any machine capable of executing the instructions 916, sequentially or otherwise, that specify actions to be taken by the machine 900. Further, while only a single machine 900 is illustrated, the term "machine" shall also be taken to include a collection of machines 900 that individually or jointly execute the instructions 916 to perform any one or more of the methodologies discussed herein.

In various embodiments, the machine 900 comprises processors 910, memory 930, and I/O components 950, which can be configured to communicate with each other via a bus 902. In an example embodiment, the processors 910 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 912 and a processor 914 that may execute the instructions 916. The term "processor" is intended to include multi-core processors 910 that may comprise two or more independent processors 912, 914 (also referred to as "cores") that can execute the instructions 916 contemporaneously. Although FIG. 9 shows multiple processors 910, the machine 900 may include a single processor 912 with a single core, a single processor 912 with multiple cores (e.g., a multi-core processor 912), multiple processors 910 with a single core, multiple processors 910 with multiples cores, or any combination thereof.

The memory 930 comprises a main memory 932, a static memory 934, and a storage unit 936 accessible to the processors 910 via the bus 902, according to some embodiments. The storage unit 936 can include a machine-readable medium 938 on which are stored the instructions 916 embodying any one or more of the methodologies or functions described herein. The instructions 916 can also reside, completely or at least partially, within the main memory 932, within the static memory 934, within at least one of the processors 910 (e.g., within the processor's cache memory), or any suitable combination thereof, during execution thereof by the machine 900. Accordingly, in various embodiments, the main memory 932, the static memory 934, and the processors 910 are considered machine-readable media 938.

As used herein, the term "memory" refers to a machine-readable medium 938 able to store data temporarily or permanently and may be taken to include, but not be limited to, random-access memory (RAM), read-only memory (ROM), buffer memory, flash memory, and cache memory. While the machine-readable medium 938 is shown, in an example embodiment, to be a single medium, the term "machine-readable medium" should be taken to include a single medium or multiple media (e.g., a centralized or distributed database, or associated caches and servers) able to store the instructions 916. The term "machine-readable medium" shall also be taken to include any medium, or combination of multiple media, that is capable of storing instructions (e.g., instructions 916) for execution by a machine (e.g., machine 900), such that the instructions, when executed by one or more processors of the machine (e.g., processors 910), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 950 include a wide variety of components to receive input, provide output, produce output, transmit information, exchange information, capture measurements, and so on. In general, it will be appreciated that the I/O components 950 can include many other components that are not shown in FIG. 9. The I/O components 950 are grouped according to functionality merely for simplifying the following discussion, and the grouping is in no way limiting. In various example embodiments, the I/O components 950 include output components 952 and input components 954. The output components 952 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 954 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. In various embodiments, outputs of a timing analysis are used to generate updates and changes to a circuit design, and after a final closure of timing with all associated timing thresholds and design requirements met, circuit design output files are used to generate masks and other physical outputs for generation of a circuit. As described herein, "requirements," "design elements," and other aspects of a circuit design refer to selectable values that are set as part of the design of a circuit. Such design requirements or elements may be adjusted by a system operator or circuit designer to suit the particular goals of a project or circuit that results from the operations described herein.

Communication can be implemented using a wide variety of technologies. The I/O components 950 may include communication components 964 operable to couple the machine 900 to a network 980 or devices 970 via a coupling 982 and a coupling 972, respectively. For example, the communication components 964 include a network interface component or another suitable device to interface with the network 980. In further examples, the communication components 964 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 970 may be another machine or any of a wide variety of peripheral devices (e.g., a peripheral device coupled via a USB).

In various example embodiments, one or more portions of the network 980 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 980 or a portion of the network 980 may include a wireless or cellular network, and the coupling 982 may be a Code Division Multiple Access (CDMA) connection, a Global System for Mobile communications (GSM) connection, or another type of cellular or wireless coupling. In this example, the coupling 982 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-speed Packet Access (HSPA), Worldwide Interoperability for Microwave Access (WiMAX), Long-Term Evolution (LTE) standard, others defined by various standard-setting organizations, other long-range protocols, or other data-transfer technology.

Furthermore, the machine-readable medium 938 is non-transitory (in other words, not having any transitory signals) in that it does not embody a propagating signal. However, labeling the machine-readable medium 938 "non-transitory" should not be construed to mean that the machine-readable medium 938 is incapable of movement; the machine-readable medium 938 should be considered as being transportable from one physical location to another. Additionally, since the machine-readable medium 938 is tangible, the machine-readable medium 938 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to" or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
   determining, by a hardware processor, a set of node impedance states for a set of nodes in a circuit design at a set of time points, the determining the set of node impedance states including determining a set of reasons for the determined set of node impedance states;

storing, by the hardware processor, impedance data based on the determining the set of node impedance states, the impedance data including information regarding the set of determined node impedance states and the set of determined reasons for the set of determined node impedance states; and generating, by the hardware processor, output data based on the impedance data, the output data at least describing, in association with a given node in the set of nodes, a given node impedance state for the given node and a subset of reasons for the given node impedance state, the given node impedance state being from the set of determined node impedance states and the subset of reasons from the set of determined reasons.

2. The method of claim 1, wherein responsive to determining that the given node impedance state comprises a low impedance state, the subset of reasons for the given node impedance state at least describes one conductive path, in the circuit design, between the given node and at least one of ground or a voltage source in the circuit design.

3. The method of claim 1, wherein responsive to determining that the given node impedance state comprises a high impedance state, the subset of reasons for the given node impedance state at least describes all conductive paths in the circuit design reachable from the given node.

4. The method of claim 1, wherein the subset of reasons for the given node impedance state at least describes one of a voltage of the given node, an on/off state of a circuit component of the circuit design coupled to the given node, and a set of component parameters that determine the on/off state of the circuit component.

5. The method of claim 1, wherein the output data comprises a text-based report.

6. The method of claim 1, wherein the output data comprises a circuit design schematic representing the circuit design.

7. The method of claim 6, wherein the generating the output data comprises back-annotating, based on the subset of reasons, an existing circuit design schematic representing the circuit design.

8. The method of claim 6, wherein the circuit schematic at least depicts the given node, a set of conductive paths connecting the given node to a subset of nodes in the set of nodes, the given node impedance state for the given node impedance state, and the subset of reasons for the given node impedance state.

9. The method of claim 8, wherein the subset of reasons is depicted on the circuit design by a set of annotations included by the circuit design schematic.

10. The method of claim 1, further comprising accessing, by the hardware processor, a set of parameters at least specifying the set of nodes and the set of time points, the determining the set of node impedance states being performed according to the set of parameters.

11. A device comprising:
a memory storing instructions; and
a hardware processor communicatively coupled to the memory and configured by the instructions to:
access a set of parameters at least specifying a set of nodes in a circuit design and a set of time points;
determine a set of node impedance states for the set of nodes at the set of time points, wherein to determine the set of node impedance states, the hardware processor is further configured to determine a set of reasons for the determined set of node impedance states;

store, to the memory, impedance data based on the determining the set of node impedance states, the impedance data including information regarding the set of determined node impedance states and the set of determined reasons for the set of determined node impedance states; and generate output data based on the impedance data, the output data at least describing, in association with a given node in the set of nodes, a given node impedance state for the given node and a subset of reasons for the given node impedance state, the given node impedance state being from the set of determined node impedance states and the subset of reasons from the set of determined reasons.

12. The device of claim 11, wherein responsive to a determination that the given node impedance state comprises a low impedance state, the subset of reasons for the given node impedance state at least describes one conductive path, in the circuit design, between the given node and at least one of ground or a voltage source in the circuit design.

13. The device of claim 11, wherein responsive to a determination that the given node impedance state comprises a high impedance state, the subset of reasons for the given node impedance state at least describes all conductive paths in the circuit design reachable from the given node.

14. The device of claim 11, wherein the subset of reasons for the given node impedance state at least describes one of a voltage of the given node, an on/off state of a circuit component of the circuit design coupled to the given node, and a set of component parameters that determine the on/off state of the circuit component.

15. The device of claim 11, wherein the output data comprises a text-based report.

16. The device of claim 11, wherein the output data comprises a circuit design schematic representing the circuit design.

17. The device of claim 16, wherein to generate the output data, the hardware processor is further configured to back-annotate, based on the subset of reasons, an existing circuit design schematic representing the circuit design.

18. The device of claim 16, wherein the circuit schematic at least depicts the given node, a set of paths connecting the given node to a subset of nodes in the set of nodes, the given node impedance state for the given node impedance state, and the subset of reasons for the given node impedance state.

19. The device of claim 18, wherein the subset of reasons is depicted on the circuit design by a set of annotations included by the circuit design schematic.

20. A non-transitory computer-readable medium comprising instructions that, when executed by a hardware processor of a device, cause the device to perform operations comprising:
initiating a transient analysis of a circuit design including a set of nodes;
determining, during the transient analysis of the circuit design, a set of node impedance states for the set of nodes at a set of time points, the determining the set of node impedance states including determining a set of reasons for the determined set of node impedance states;
storing impedance data based on the determining the set of node impedance states, the impedance data including information regarding the set of determined node impedance states and the set of determined reasons for the set of determined node impedance states; and generating output data based on the impedance data, the output data at least describing, in association with a given node in the set of nodes, a given node impedance state for the given node and a subset of reasons for the given node impedance state, the given node impedance state being from the set of determined node impedance states and the subset of reasons from the set of determined reasons.

* * * * *